United States Patent [19]

Koetsch

[11] 4,201,928
[45] May 6, 1980

[54] POWER TRANSISTOR ACTUATING AND BOOTSTRAP DRIVE CIRCUIT

[75] Inventor: Philip W. Koetsch, San Diego, Calif.

[73] Assignee: NCR Corporation, Dayton, Ohio

[21] Appl. No.: 872,965

[22] Filed: Jan. 27, 1978

[51] Int. Cl.$^2$ .............................................. H03K 1/00
[52] U.S. Cl. .................................. 307/270; 307/282; 307/300
[58] Field of Search ................ 307/270, 282, 300, 315

[56] References Cited

U.S. PATENT DOCUMENTS

| | | | |
|---|---|---|---|
| 3,852,620 | 12/1974 | Milberger et al. | 307/300 |
| 3,986,052 | 10/1976 | Hunter | 307/270 |
| 3,999,086 | 12/1976 | Ekelund | 307/270 |
| 4,123,670 | 10/1978 | Pollmeier | 307/300 |

Primary Examiner—Stanley D. Miller, Jr.
Assistant Examiner—B. P. Davis
Attorney, Agent, or Firm—J. T. Cavender; Stephen F. Jewett; Edward Dugas

[57] ABSTRACT

A drive circuit for a power switching transistor, in which an actuating circuit provides a low level gating current to actuate and maintain the transistor in a conductive state, and a bootstrap drive circuit is provided to enable operation over the full load range of the transistor with minimal input power loss. Rapid turn-off is facilitated by means of a deactuating transistor which connects the base of the switching transistor to a negative pull-down voltage level, and which also diverts gating current away from the switching transistor. A shunt circuit is provided in association with the bootstrap circuit to prevent saturation of relatively high gain switching transistors.

7 Claims, 2 Drawing Figures

POWER TRANSISTOR ACTUATING AND BOOTSTRAP DRIVE CIRCUIT

BACKGROUND OF THE INVENTION

1. Field of the Invention

This invention relates to circuitry for driving an inductively loaded switching transistor, and more particularly to such circuitry which employs a bootstrap circuit to couple the load with the transistor drive.

2. Description of the Prior Art

Distinct problems can arise when power transistors are used to switch relatively high levels of current. For example, in recent years the use of offline switching power supplies has become popular. These devices are run directly off a main power line, say 115 volts, and require that the transistors employed in switching the inductive inverters be capable of switching currents in the order of 10 to 15 amperes. The problem is compounded because, in order to accommodate the high voltages involved, transistor gain (beta) is generally sacrificed to the extent that betas of 3 to 5 are typical. Thus, the transistor drive circuits must be capable of supplying up to 5 amperes to the base of each switching transistor.

The basic configuration of a typical drive circuit of conventional design is illustrated in FIG. 1. In this circuit a switching transistor Qa controls the application of power to an inductive load 1, such as one leg of an inverter. Qa is actuated to a conductive state by the application of an appropriate signal to the base of an actuating transistor Qb, which becomes conductive and permits current flow from a positive bus V+, through a current limiting resistor Ra, to the base of Qa. Ra must be small enough to permit the high base currents referred to above under heavy load conditions, and also to allow for manufacturing tolerances in the transistors. As a result the current delivered to the base of Qa may be considerably greater than that required to keep the transistor conductive, especially during the initial transient period before full load develops and during periods of relatively low loads. This, in turn, leads to an unnecessary power loss which reduces the efficiency of the power supply, and in addition switching transistor Qa may become saturated and thereby suffer a deterioration in its turn-off time. At the end of the driving period, the drive signal is removed from the base of Qb and a separate signal is applied to gate a third transistor Qc, which connects the base of Qa to ground to enhance turn-off.

It can thus be seen that the conventional drive circuit described above suffers in terms of both power efficiency and the time required for turn-off. Various bootstrap circuits have been developed which could be used to alleviate the efficiency problem by continuously tying the magnitude of the gating current supplied to the switching transistor to the magnitude of the load current. Thus, a decrease in load current is accompanied by a decrease in the base current necessary to keep the switching transistors conductive.

While greatly enhancing the efficiency of the drive circuit, the basic bootstrap does not solve all the problems, and introduces some of its own. It does not provide a means for initially gating the switching transistor, and should the load current subsequently dip low enough it is possible for the transistor to turn off with no means to re-actuate it. There may still be a problem in the time required to turn off the switching transistor, which may be aggravated if the load current preceding turn-off goes high enough to drive the transistor into saturation. Furthermore, there may still be a need for a separately controlled turn-off transistor.

SUMMARY OF THE INVENTION

In view of the problems identified above, the object of the present invention is the provision of a novel and improved drive circuit for an inductively loaded switching transistor, which supplies an efficient gating current in response to a drive signal to keep the transistor conductive with minimal power loss, which causes rapid turn-off of the transistor at the conclusion of the drive signal, and which avoids saturating the transistor.

These and other objects are accomplished with a drive circuit comprising an actuating circuit which provides a first, low level gating current to initially actuate the switching transistor and maintain it in a conductive state during periods of low load, and a bootstrap circuit which supplies a load-related gating current to keep the transistor conductive during the remainder of the driving signal. To enhance power efficiency, the first gating current is established at a substantially lower lever than the full load capability of the drive circuit.

In a preferred embodiment the bootstrap circuit includes a transformer with a primary winding in a load circuit for the switching transistor. The transformer secondary is coupled in circuit with the base of the switching transistor, and the transformer turns ratio is related to the transistor gain, such that its secondary provides a gating current sufficient to maintain the transistor in a conductive state over substantially the full load range in excess of the low load range associated with the actuating circuit. The switching transistor is rapidly deactuated at the end of a driving signal by means of a pull-down transistor having its collector-emitter circuit connected between the base of the switching transistor and a negative potential bus. Driving pulses are applied to the circuit through a pulse transformer having one secondary winding coupled to the actuating circuit, and another secondary winding connected in circuit with the base of the deactuating transistor to render it nonconductive and conductive, respectively, during the presence and absence of a drive pulse. The deactuating transistor is also connected in circuit with the bootstrap circuit to divert the bootstrap gating current from the switching transistor when a drive pulse is removed. In addition, a shunt circuit is provided in the bootstrap circuit to shunt any gating current which substantially exceeds the saturation level of the load switching transistor.

DESCRIPTION OF THE DRAWINGS

Other objects, features, and advantages of the invention will be apparent to one skilled in the art from a review of the following detailed description, taken together with the accompanying drawings, in which.

DETAILED DESCRIPTION OF A PREFERRED EMBODIMENT

Figure 2:
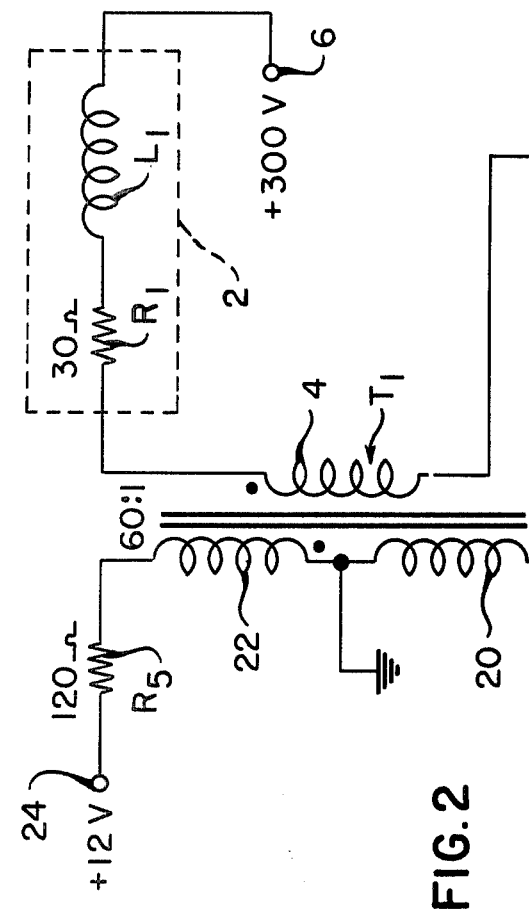
FIG. 2 is a circuit diagram of a preferred embodiment of the invention.
Figure 1:
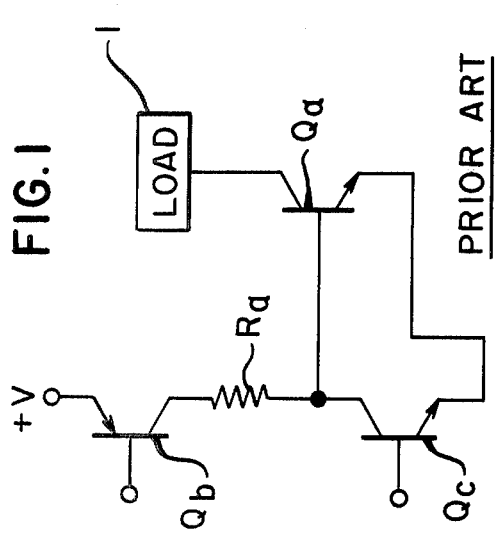
FIG. 1 is a circuit diagram, referred to in the Description of the Prior Art, of a prior art drive circuit.

Referring to FIG. 2, a novel circuit for driving a power transistor is shown which overcomes the problems associated with the prior art. A power switching transistor $Q_1$ is shown as having a series-connected load circuit which includes a load 2, consisting of an inductance $L_1$ and a current limiting resistor $R_1$, and the primary winding 4 of a current transformer $T_1$. In a typical application of the transistor drive circuit described herein, load 2 is the output transformer of an inverter circuit, which characteristically has an LC averaging filter connected in its secondary; transistor $Q_1$ is one of a plurality of transistors controlling an energizing circuit for the load from a positive voltage bus 6, such that load 2 produces a DC output in response to an AC input at the transistor drive circuits. Various well-known inverter architectures may be used, such as a basic full wave bridge, half-bridge, and push-pull full wave bridge. In the first two inverter types mentioned, the power switching transistors are isolated from ground and are generally floated at a higher voltage level, whereas in the full wave push-pull bridge circuit the power switching transistor is tied to ground. The arrangement depicted in FIG. 2 is applicable to all such inverter circuits.

An actuating circuit for switching transistor $Q_1$ comprises an isolating pulse transformer $T_2$ having its primary winding 10 connected between a positive voltage bus 12 and the collector of a transistor $Q_2$, the base of which transistor is connected to a drive pulse output terminal 14, and the emitter of which is grounded. Transformer $T_2$ includes two secondary windings 16 and 18, with a grounded center tap. The first winding 16 is connected through the emitter-collector circuit of another transistor $Q_3$, the base of which is connected to ground through a resistor $R_2$. The collector of $Q_3$ is connected through another resistor $R_3$ and a diode $D_1$ to the base of $Q_1$, diode $D_1$ being oriented to transmit current towards the base of switching transistor $Q_1$, and to block current flow away from the base of $Q_1$. The various components of the actuating circuit are selected such that a relatively low level actuating current is delivered in response to the application of a drive pulse at input terminal 14. The magnitude of the drive current is sufficient to gate switching transistor $Q_1$ into a conductive mode and sustain it conductive for the duration of the drive pulse, but is insufficient to permit full current flow through the collector-emitter circuit of transistor $Q_1$ under appreciable load conditions. The power input required to actuate $Q_1$ and keep it conductive in a correspondingly low value.

The actuating circuit described thus far provides a relatively small base current which restricts the load current through transistor $Q_1$ to a low level range. To enable the higher load currents required under normal operation, a bootstrap drive circuit is provided which delivers a second gating current to the base of the transistor $Q_1$, the magnitude of the second gating current varying in positive proportion to the current drawn by load 2. This bootstrap circuit comprises the primary winding 4 of transformer $T_1$ in the load circuit of switching transistor $Q_1$, a first secondary winding 20 of $T_1$, and in series therewith the emitter-collector circuit of a switching transistor $Q_4$ which is biased to ground through resistor $R_4$, a diode $D_2$, and diode $D_1$ from the actuating circuit. The fixed turns ratio between the primary winding 4 and secondary winding 20 of transformer $T_1$ is selected such that the gating current provided to switching transistor $Q_1$ is sufficient to maintain that transistor in a conductive state, over substantially the full load range in excess of the low load range associated with the actuating circuit. For example, in FIG. 2 a 1:5 turns ratio is employed for a $Q_1$ beta of 5.

Transformer $T_1$ also includes a second secondary winding 22 which is employed to balance the hysterisis effects of pulsing $T_1$ with a load pulse of only one polarity. Secondary winding 22 is connected on one side to a grounded center tap and winding 20, and on the other side through a resistor $R_5$ to a voltage bus 24. The polarity of winding 22 is such that it produces a counterbalancing flux to that of winding 20.

During the period it is conductive, switching transistor $Q_1$ accumulates an electrical charge in its base region, which must be removed before the transistor can be turned off. To facilitate rapid turnoff of $Q_1$ a deactuating circuit is provided, comprising a deactuating switching transistor $Q_5$, the collector of which is connected directly to the anode of diode $D_1$, and is also connected through a small resistor $R_6$ to the junction between the base of switching transistor $Q_1$ and the cathode of diode $D_1$. The base of the deactuating transistor $Q_5$ is connected to ground through a resistor $R_7$ and is also connected for conduction through a diode $D_3$ to the secondary winding 8 of isolating pulse transformer $T_2$, while the emitter of $Q_5$ is connected to a negative pull-down voltage bus 26.

A remaining element of the drive circuit comprises a diode $D_4$ which is connected to conduct from the output side of the secondary winding 20 of transformer $T_1$, to the collector of switching transistor $Q_1$. In the case of high gain switching transistors, the base drive current provided from bootstrap transformer $T_1$ may be excessive and drive $Q_1$ into saturation, thereby increasing the amount of time necessary to turn $Q_1$ off. Diode $D_4$ is selected such that, with the impedance presented by the remainder of the bootstrap drive circuit to secondary transformer winding 20, a voltage is established across $D_4$ sufficient to drive it into conduction when the bootstrap gating current exceeds the saturation level for switching transistor $Q_1$. Any excess gating current beyond this level is shunted by diode $D_4$ to the collector emitter circuit of switching transistor $Q_1$.

In operation, with switching transistor $Q_1$ initially in a non-conductive state, its inductive load will appear as a high impedance or open circuit. When it is desired to operate the switching transistor, a drive pulse is supplied to input terminal 14, typically for a pulse duration of 25 micro seconds in the case of inverter operation. The drive pulse gates transistor $Q_2$, which closes an actuating circuit for isolating pulse transformer $T_2$ such that current flows through the primary winding of $T_2$ and induces a corresponding current flow in the secondary windings 16 and 18 of $T_2$. The current in secondary winding 16 flows into the emitter of transistor $Q_3$, turning on that transistor and continuing to flow through resistor $R_3$ and diode $D_1$ into the base of switching transistor $Q_1$. Given the initial high impedance load on $Q_1$, the low level gating current thus provided is sufficient to turn on $Q_1$ so that current begins to flow through load 2 and transformer $T_1$.

At the same time as it actuates $Q_1$, the drive pulse at input terminal 14 also establishes a current in secondary winding 18 of isolating pulse transformer $T_2$, which reverse biases deactuating transistor $Q_4$ and holds it in a non-conductive state.

As the transient build-up of current through the inductive load of switching transistor $Q_1$ progresses, a steadily increasing current is established through the primary winding 4 of bootstrap transformer $T_1$, which sets up a corresponding current in secondary winding 20. This secondary winding current is transmitted through transistor $Q_4$ (which is maintained in a conductive state by means of its base connection to ground through resistor $R_4$), diode $D_2$, and diode $D_1$ to the base of $Q_1$. The bootstrap gating current just described is accummulated with the actuating gating current. Since it varies in direct proportion to the load current, switching transistor $Q_1$ is maintained in a conductive state over substantially the full load range without wasting excess gating current at the lower load levels. Also, as described above, diode $D_4$ shunts any excess bootstrap gating current to keep a high gain switching transistor $Q_1$ from saturating.

At the termination of the drive pulse, it is desirable that switching transistor $Q_1$ be turned off rapidly. This is accomplished by input transistor $Q_2$ turning off at the end of the pulse, which terminates current flow through the primary and secondary windings of isolation transformer $T_2$. This in turn removes the reverse bias on deactuating transistor $Q_5$, and instead forward biases $Q_5$ by means of the grounded base connection through resistor $R_7$ and the negative pull-down voltage at the emitter. The gating of transistor $Q_5$ has a double effect in rapidly deactuating switching transistor $Q_1$. First, charge is rapidly drawn out of the base of $Q_1$, through resistor $R_6$ and deactuating transistor $Q_5$, to the negative potential bus 26. (The provision of resistor $R_6$ limits the reverse base current imposed on $Q_1$ and thereby enchances the second-breakdown rating of that transistor.) Second, $Q_5$ diverts any bootstrap drive current away from the base of switching transistor $Q_1$, and thereby further contributes to a rapid deactuation of that transistor.

Within a very short period of time following the termination of the drive pulse at input terminal 14, switching transistor $Q_1$ has been turned off and the circuit is ready to receive the next drive pulse. When this occurs, the load of switching transistor $Q_1$ will again initially be seen as a high impedance or open circuit, which permits $Q_1$ to be turned on by the low level gating current provided by the actuating circuit described above. As the load current builds up and the impedance presented by the inductive load decreases in accordance with its transient DC response, the gating current from the bootstrap drive circuit will increase and become predominant, enabling switching transistor $Q_1$ to operate over the full load range with only a minimal power loss in the drive circuit.

A novel and efficient drive circuit for a switching transistor has thus been shown and described, featuring both a low power loss, and an improved means for actuating, maintaining, and turning off the switching transistor. As numerous variations and modifications of this particular circuit will be apparent to those skilled in the art, it is intended that the invention be limited only by the terms of the appended claims.

I claim:

1. A drive circuit for a switching transistor, said switching transistor comprising a base, collector, and emitter and being adapted to control the application of electrical power to an inductive load, comprising:

an actuating circuit connected to deliver a first gating current to the base of said switching transistor in response to a driving signal, the magnitude of said current being sufficient to actuate and maintain said switching transistor in a conductive state during a low range;

a bootstrap drive circuit connected to deliver a second gating current to the base of said switching transistor, the magnitude of which varies in positive proportion to the switching transistor's load and is sufficient to maintain said switching transistor in a conductive state for loads in excess of said low load range;

circuit means for rapidly deactuating said switching transistor in response to the removal of a driving signal, said deactuating circuit means comprising a deactuating switching transistor connected in circuit with the base of said switching transistor so as to render said switching transistor nonconductive when said deactuating switching transistor is conductive; and a pulse transformer having a primary winding adapted to receive a driving pulse signal, a first secondary winding connected in circuit with the remainder of said actuating circuit, and a second secondary winding connected in circuit with the base of said deactuating switching transistor to render said deactuating switching transistor nonconductive when a drive pulse is applied to said pulse transformer, and conductive during the absence of a drive pulse at said pulse transformer.

2. A drive circuit for a switching transistor, said switching transistor comprising a base, collector, and emitter and being adapted to control the application of electrical power to an inductive load, comprising:

an actuating circuit connected to deliver a first gating current to the base of said switching transistor in response to a driving signal, the magnitude of said current being sufficient to actuate and maintain said switching transistor in a conductive state during a low range;

a bootstrap drive circuit connected to deliver a second gating current to the base of said switching transistor, the magnitude of which varies in positive proportion to the switching transistor's load and is sufficient to maintain said switching transistor in a conductive state for loads in excess of said low load range;

circuit means for rapidly deactuating said switching transistor in response to the removal of a driving signal, said deactuating circuit means comprising a deactuating switching transistor connected in circuit with the base of said switching transistor so as to render said switching transistor nonconductive when said deactuating switching transistor is conductive;

a negative potential bus, said deactuating switching transistor operatively connecting the base of said switching transistor to said negative potential bus in response to the removal of a driving signal; and circuit means for rapidly gating said deactuating switching transistor when a driving signal is removed.

3. A drive circuit for a switching transistor, said switching transistor comprising a base, collector, and emitter and being adapted to control the application of electrical power to an inductive load, comprising:

an actuating circuit including a pulse transformer having a primary winding adapted to receive a driving pulse, and a secondary winding connected in circuit with the remainder of said actuating circuit connected to deliver a first, relatively low level gating current to the base of said switching transistor in response to a driving signal, the magnitude of said current being less than the current required during full load conditions but sufficient to actuate and maintain said switching transistor in a conductive state during a low load range;

a bootstrap drive circuit comprising a load circuit for said switching transistor, a current transformer means having a primary winding in said load circuit and a secondary winding, and circuit means operatively connecting said secondary winding with the base of said switching transistor to deliver a second gating current to said base, the magnitude of which varies in positive proportion to the switching transistor's load, the transformer turns ratio being related to the switching transistor's gain such that second gating current is sufficient to maintain said switching transistor in a conductive state over substantially a full load range in excess of said low load range; and circuit means for rapidly deactuating said switching transistor in response to the removal of a driving signal, said deactuating circuit means comprising a deactuating switching transistor having its collector-emitter circuit connected in circuit with the base of said switching transistor so as to render said switching transistor nonconductive when the deactuating transistor is conductive, and said pulse transformer including a second secondary winding connected in circuit with the base of said deactuating transistor to render said deactuating transistor nonconductive when a drive pulse is applied to said pulse transformer, and conductive during the absence of a drive pulse at said pulse transformer.

4. A drive circuit for a switching transistor, said switching transistor comprising a base, collector, and emitter and being adapted to control the application of electrical power to an inductive load, comprising:

an actuating circuit including a pulse transformer having a primary winding adapted to receive a driving pulse, and a secondary winding connected in circuit with the remainder of said actuating circuit connected to deliver a first, relatively low level gating current to the base of said switching transistor in response to a driving signal, the magnitude of said current being less than the base current required during full load conditions but sufficient to actuate and maintain said switching transistor in a conductive state during a low load range;

a bootstrap drive circuit comprising a load circuit for said switching transistor, a current transformer means having a primary winding in said load circuit and a secondary winding, and circuit means operatively connecting said secondary winding with the base of said switching transistor to deliver a second gating current to said base, the magnitude of which varies in positive proportion to the switching transistor's load, the transformer turns ratio being related to the switching transistor's gain such that second gating current is sufficient to maintain said switching transistor in a conductive state over substantially a full load range in excess of said low load range; and circuit means for rapidly deactuating said switching transistor in response to the removal of a driving signal, said deactuating circuit means comprising a deactuating transistor having its collector-emitter circuit connected in circuit with the base of said switching transistor so as to render said switching transistor nonconductive when the deactuating transistor is conductive, a negative potential bus, said deactuating transistor operatively connecting the base of said switching transistor to said negative potential bus and said pulse transformer including a second secondary winding connected in circuit with the base of said deactuating transistor to render said deactuating transistor nonconductive when a drive pulse is applied to said pulse transformer, and conductive during the absence of a drive pulse at said pulse transformer.

5. A drive circuit for a switching transistor, said switching transistor comprising a base, collector, and emitter and being adapted to control the application of electrical power to an inductive load, comprising:

an actuating circuit including a pulse transformer having a primary winding adapted to receive a driving pulse, and a secondary winding connected in circuit with the remainder of said actuating circuit connected to deliver a first, relatively low level gating current to the base of said switching transistor in response to a driving signal, the magnitude of said current being less than the base current required during full load conditions but sufficient to actuate and maintain said switching transistor in a conductive state during a low load range;

a bootstrap drive circuit comprising a load circuit for said switching transistor, a current transformer means having a primary winding in said load circuit and a secondary winding, and circuit means operatively connecting said secondary winding with the base of said switching transistor to deliver a second gating current to said base, the magnitude of which varies in positive proportion to the switching transistor's load, the transformer turns ratio being related to the switching transistor's gain such that said second gating current is sufficient to maintain said switching transistor in a conductive state over substantially a full load range in excess of said low load range;

circuit means for rapidly deactuating said switching transistor in response to the removal of a driving signal, said deactuating circuit means comprising a deactuating switching transistor having its collector-emitter circuit connected in circuit with the base of said switching transistor so as to render said switching transistor nonconductive when the deactuating transistor is conductive, and said pulse transformer including a second secondary winding connected in circuit with the base of said deactuating transistor; and a diode means connected to deliver gating current to the base of said switching transistor, the collector-emitter circuit of said deactuating transistor being connected;

(a) directly to the anode of said diode means to divert gating current from said switching transistor when a drive pulse is removed, and (b) through a resistance means to the base of said switching transistor to draw charge out of said base at a controlled rate when a drive pulse is removed.

6. A drive circuit for a switching transistor, said switching transistor comprising a base, collector, and emitter and being adapted to control the application of electrical power to an inductive load, comprising:

an actuating circuit connected to deliver a first, relatively low level gating current to the base of said switching transistor in response to a driving signal, the magnitude of said current being less than the base current required during full load conditions but sufficient to actuate and maintain said switching transistor in a conductive state during a low load range;

a bootstrap drive circuit comprising a load circuit for said switching transistor, a current transformer means having a primary winding in said load circuit and a secondary winding, and circuit means operative connecting said secondary winding with the base of said switching transistor to deliver a second gating current to said base, the magnitude of which varies in positive proportion to the switching transistor's load, the transformer turns ratio being related to the switching transistor's gain such that said second gating current is sufficient to maintain said switching transistor in a conductive state over substantially a full load range in excess of said low load range; and a shunt circuit for shunting from the base of said switching transistor that portion of the second gating current which substantially exceeds the saturation level of said switching transistor.

7. The drive circuit of claim 6, said shunt circuit comprising a diode connected to conduct current from the secondary of said current transformer to the collector-emitter circuit of said switching transistor, said bootstrap drive circuit presenting an impedance to said transformer secondary sufficient to establish a voltage across said diode to render the diode conductive when said second gating current exceeds the saturation level of said switching transistor, and thereby shunt said excess current away from the base of said switching transistor.

* * * * *